(12) United States Patent
Arena-Foster et al.

(10) Patent No.: US 6,924,086 B1
(45) Date of Patent: Aug. 2, 2005

(54) DEVELOPING PHOTORESIST WITH SUPERCRITICAL FLUID AND DEVELOPER

(75) Inventors: Chantal J. Arena-Foster, Mesa, AZ (US); Allan Wendell Awtrey, Forth Worth, TX (US); Nicholas Alan Ryza, Austin, TX (US); Paul Schilling, Granite Bay, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/367,078

(22) Filed: Feb. 14, 2003

Related U.S. Application Data

(60) Provisional application No. 60/357,756, filed on Feb. 15, 2002.

(51) Int. Cl.[7] ............................................. G03F 7/30
(52) U.S. Cl. .................................. 430/311; 430/322
(58) Field of Search ................................ 430/311, 322

(56) References Cited

U.S. PATENT DOCUMENTS

| | | |
|---|---|---|
| 2,439,689 A | 4/1948 | Hyde et al. |
| 2,617,719 A | 11/1952 | Stewart |
| 3,890,176 A | 6/1975 | Bolon |
| 3,900,551 A | 8/1975 | Bardoncelli et al. |
| 4,219,333 A | 8/1980 | Harris |
| 4,341,592 A | 7/1982 | Shortes et al. |
| 4,349,415 A | 9/1982 | DeFilippi et al. |
| 4,475,993 A | 10/1984 | Blander et al. |
| 4,749,440 A | 6/1988 | Blackwood et al. |
| 4,838,476 A | 6/1989 | Rahn |
| 4,877,530 A | 10/1989 | Moses |
| 4,879,004 A | 11/1989 | Oesch et al. |
| 4,923,828 A | 5/1990 | Gluck et al. |
| 4,925,790 A | 5/1990 | Blanch et al. |
| 4,933,404 A | 6/1990 | Beckman et al. |
| 4,944,837 A | 7/1990 | Nishikawa et al. |
| 5,011,542 A | 4/1991 | Weil |

(Continued)

FOREIGN PATENT DOCUMENTS

| | | | |
|---|---|---|---|
| DE | 39 04 514 C2 | 8/1990 | ............. D06L/1/00 |
| DE | 40 04 111 C2 | 8/1990 | ............. D06L/1/00 |
| DE | 39 06 724 C2 | 9/1990 | ............. D06P/1/90 |
| DE | 39 06 737 A1 | 9/1990 | ........... D06M/11/59 |
| DE | 44 29 470 A1 | 3/1995 | ............. D06P/5/04 |

(Continued)

OTHER PUBLICATIONS

US 6,001,133, 12/1999, DeYoung et al. (withdrawn)
US 6,486,282, 11/2002, Dammel et al. (withdrawn)
J.B. Rubin et al. "A Comparison of Chilled DI Water/Ozone and Co2–Based Supercritical Fluids as Replacements for Photoresist–Stripping Solvents", IEEE/CPMT Int'l Electronics Manufacturing Technology Symposium, 1998, pp. 308–314.
"Los Almos National Laboratory," Solid State Technology, pp. S10 & S14, Oct. 1998.

(Continued)

*Primary Examiner*—Hoa Van Le
(74) *Attorney, Agent, or Firm*—Haverstock & Owens LLP

(57) ABSTRACT

A method of developing a polymeric film without the need for a water rinse step. An object having a surface supporting a polymeric film is placed onto a support region within a pressure chamber. A fluid and developer is introduced into the pressure chamber and the object is processed at supercritical conditions to develop the polymeric film such that the polymeric film is not substantially deformed. The pressure chamber is then vented.

22 Claims, 2 Drawing Sheets

U.S. PATENT DOCUMENTS

| | | |
|---|---|---|
| 5,013,366 A | 5/1991 | Jackson et al. |
| 5,068,040 A | 11/1991 | Jackson |
| 5,071,485 A | 12/1991 | Matthews et al. |
| 5,105,556 A | 4/1992 | Kurokawa et al. |
| 5,158,704 A | 10/1992 | Fulton et al. |
| 5,174,917 A | 12/1992 | Monzyk |
| 5,185,058 A | 2/1993 | Cathey, Jr. |
| 5,185,296 A | 2/1993 | Morita et al. |
| 5,196,134 A | 3/1993 | Jackson |
| 5,201,960 A | 4/1993 | Starov |
| 5,213,619 A | 5/1993 | Jackson et al. |
| 5,215,592 A | 6/1993 | Jackson |
| 5,225,173 A | 7/1993 | Wai |
| 5,236,602 A | 8/1993 | Jackson |
| 5,237,824 A | 8/1993 | Pawliszyn |
| 5,238,671 A | 8/1993 | Matson et al. |
| 5,250,078 A | 10/1993 | Saus et al. |
| 5,261,965 A | 11/1993 | Moslehi |
| 5,266,205 A | 11/1993 | Fulton et al. |
| 5,269,815 A | 12/1993 | Schlenker et al. |
| 5,269,850 A | 12/1993 | Jackson |
| 5,274,129 A | 12/1993 | Natale |
| 5,285,352 A | 2/1994 | Pastore et al. |
| 5,288,333 A | 2/1994 | Tanaka et al. |
| 5,290,361 A | 3/1994 | Hayashida et al. |
| 5,294,261 A | 3/1994 | McDermott et al. |
| 5,298,032 A | 3/1994 | Schlenker et al. |
| 5,304,515 A | 4/1994 | Morita et al. |
| 5,306,350 A | 4/1994 | Hoy et al. |
| 5,312,882 A | 5/1994 | DeSimone et al. |
| 5,314,574 A | 5/1994 | Takahashi |
| 5,316,591 A | 5/1994 | Chao et al. |
| 5,320,742 A | 6/1994 | Fletcher et al. |
| 5,328,722 A | 7/1994 | Ghanayem et al. |
| 5,334,332 A | 8/1994 | Lee |
| 5,334,493 A | 8/1994 | Fujita et al. |
| 5,352,327 A | 10/1994 | Witowski |
| 5,356,538 A | 10/1994 | Wai et al. |
| 5,364,497 A | 11/1994 | Chau et al. |
| 5,370,740 A | 12/1994 | Chao et al. |
| 5,370,741 A | 12/1994 | Bergman |
| 5,370,742 A | 12/1994 | Mitchell et al. |
| 5,401,322 A | 3/1995 | Marshall |
| 5,403,621 A | 4/1995 | Jackson et al. |
| 5,403,665 A | 4/1995 | Alley et al. |
| 5,417,768 A | 5/1995 | Smith, Jr. et al. |
| 5,456,759 A | 10/1995 | Stanford, Jr. et al. |
| 5,470,393 A | 11/1995 | Fukazawa |
| 5,474,812 A | 12/1995 | Truckenmuller et al. |
| 5,482,564 A | 1/1996 | Douglas et al. |
| 5,486,212 A | 1/1996 | Mitchell et al. |
| 5,494,526 A | 2/1996 | Paranjpe |
| 5,500,081 A | 3/1996 | Bergman |
| 5,501,761 A | 3/1996 | Evans et al. |
| 5,514,220 A | 5/1996 | Wetmore et al. |
| 5,522,938 A | 6/1996 | O'Brien |
| 5,547,774 A | 8/1996 | Gimzewski et al. |
| 5,550,211 A | 8/1996 | DeCrosta et al. |
| 5,580,846 A | 12/1996 | Hayashida et al. |
| 5,589,082 A | 12/1996 | Lin et al. |
| 5,589,105 A | 12/1996 | DeSimone et al. |
| 5,629,918 A | 5/1997 | Ho et al. |
| 5,632,847 A | 5/1997 | Ohno et al. |
| 5,635,463 A | 6/1997 | Muraoka |
| 5,637,151 A | 6/1997 | Schulz |
| 5,641,887 A | 6/1997 | Beckman et al. |
| 5,656,097 A | 8/1997 | Olesen et al. |
| 5,665,527 A | 9/1997 | Allen et al. |
| 5,676,705 A | 10/1997 | Jureller et al. |
| 5,679,169 A | 10/1997 | Gonzales et al. |
| 5,679,171 A | 10/1997 | Saga et al. |
| 5,683,473 A | 11/1997 | Jureller et al. |
| 5,683,977 A | 11/1997 | Jureller et al. |
| 5,688,879 A | 11/1997 | DeSimone |
| 5,700,379 A | 12/1997 | Biebl |
| 5,714,299 A | 2/1998 | Combes et al. |
| 5,725,987 A | 3/1998 | Combes et al. |
| 5,726,211 A | 3/1998 | Hedrick et al. |
| 5,730,874 A | 3/1998 | Wai et al. |
| 5,736,425 A | 4/1998 | Smith et al. |
| 5,739,223 A | 4/1998 | DeSimone |
| 5,766,367 A | 6/1998 | Smith et al. |
| 5,783,082 A | 7/1998 | DeSimone et al. |
| 5,797,719 A | 8/1998 | James et al. |
| 5,798,438 A | 8/1998 | Sawan et al. |
| 5,804,607 A | 9/1998 | Hedrick et al. |
| 5,807,607 A | 9/1998 | Smith et al. |
| 5,847,443 A | 12/1998 | Cho et al. |
| 5,866,005 A | 2/1999 | DeSimone et al. |
| 5,868,856 A | 2/1999 | Douglas et al. |
| 5,868,862 A | 2/1999 | Douglas et al. |
| 5,872,061 A | 2/1999 | Lee et al. |
| 5,872,257 A | 2/1999 | Beckman et al. |
| 5,873,948 A | 2/1999 | Kim |
| 5,881,577 A | 3/1999 | Sauer et al. |
| 5,888,050 A | 3/1999 | Fitzgerald et al. |
| 5,893,756 A | 4/1999 | Berman et al. |
| 5,896,870 A | 4/1999 | Huynh et al. |
| 5,900,354 A | 5/1999 | Batchelder |
| 5,904,737 A | 5/1999 | Preston et al. |
| 5,908,510 A | 6/1999 | McCullough et al. |
| 5,928,389 A | 7/1999 | Jevtic |
| 5,932,100 A | 8/1999 | Yager et al. |
| 5,944,996 A | 8/1999 | DeSimone et al. |
| 5,955,140 A | 9/1999 | Smith et al. |
| 5,965,025 A | 10/1999 | Wai et al. |
| 5,976,264 A | 11/1999 | McCullough et al. |
| 5,980,648 A | 11/1999 | Adler |
| 5,992,680 A | 11/1999 | Smith |
| 5,994,696 A | 11/1999 | Tai et al. |
| 6,005,226 A | 12/1999 | Aschner et al. |
| 6,017,820 A | 1/2000 | Ting et al. |
| 6,024,801 A | 2/2000 | Wallace et al. |
| 6,037,277 A | 3/2000 | Masakara et al. |
| 6,063,714 A | 5/2000 | Smith et al. |
| 6,067,728 A | 5/2000 | Farmer et al. |
| 6,099,619 A | 8/2000 | Lansbarkis et al. |
| 6,100,198 A | 8/2000 | Grieger et al. |
| 6,110,232 A | 8/2000 | Chen et al. |
| 6,114,044 A | 9/2000 | Houston et al. |
| 6,128,830 A | 10/2000 | Bettcher et al. |
| 6,140,252 A | 10/2000 | Cho et al. |
| 6,149,828 A | 11/2000 | Vaartstra |
| 6,171,645 B1 | 1/2001 | Smith et al. |
| 6,200,943 B1 | 3/2001 | Romack et al. |
| 6,216,364 B1 | 4/2001 | Tanaka et al. |
| 6,224,774 B1 | 5/2001 | DeSimone et al. |
| 6,228,563 B1 | 5/2001 | Starov et al. |
| 6,242,165 B1 | 6/2001 | Vaartstra |
| 6,251,250 B1 | 6/2001 | Keigler |
| 6,255,732 B1 | 7/2001 | Yokoyama et al. |
| 6,270,531 B1 | 8/2001 | DeYoung et al. |
| 6,270,948 B1 | 8/2001 | Sato et al. |
| 6,277,753 B1 | 8/2001 | Mullee et al. |
| 6,284,558 B1 | 9/2001 | Sakamoto |
| 6,286,231 B1 | 9/2001 | Bergman et al. |
| 6,306,564 B1 | 10/2001 | Mullee |
| 6,319,858 B1 | 11/2001 | Lee et al. |
| 6,331,487 B2 | 12/2001 | Koch |
| 6,344,243 B1 | 2/2002 | McClain et al. |
| 6,358,673 B1 | 3/2002 | Namatsu |

| | | | |
|---|---|---|---|
| 6,361,696 B1 | 3/2002 | Spiegelman et al. | |
| 6,367,491 B1 | 4/2002 | Marshall et al. | |
| 6,380,105 B1 | 4/2002 | Smith et al. | |
| 6,425,956 B1 | 7/2002 | Cotte et al. | |
| 6,436,824 B1 | 8/2002 | Chooi et al. | |
| 6,454,945 B1 | 9/2002 | Weigl et al. | |
| 6,458,494 B2 | 10/2002 | Song et al. | |
| 6,465,403 B1 | 10/2002 | Skee | 134/36 |
| 6,485,895 B1 | 11/2002 | Choi et al. | |
| 6,486,078 B1 | 11/2002 | Rangarajan et al. | |
| 6,500,605 B1 | 12/2002 | Mullee et al. | |
| 6,558,475 B1 | 5/2003 | Jur et al. | |
| 6,562,146 B1 | 5/2003 | DeYoung et al. | |
| 6,635,565 B2 | 10/2003 | Wu et al. | 438/637 |
| 6,641,678 B2 | 11/2003 | DeYoung et al. | |
| 2001/0019857 A1 | 9/2001 | Yokoyama et al. | |
| 2001/0024247 A1 | 9/2001 | Nakata | |
| 2001/0041455 A1 | 11/2001 | Yun et al. | |
| 2001/0041458 A1 | 11/2001 | Ikakura et al. | |
| 2002/0001929 A1 | 1/2002 | Biberger et al. | |
| 2002/0055323 A1 | 5/2002 | McClain et al. | |
| 2002/0074289 A1 | 6/2002 | Sateria et al. | |
| 2002/0081533 A1 | 6/2002 | Simons et al. | |
| 2002/0088477 A1 | 7/2002 | Cotte et al. | |
| 2002/0098680 A1 | 7/2002 | Goldstein et al. | |
| 2002/0106867 A1 | 8/2002 | Yang et al. | |
| 2002/0112740 A1 | 8/2002 | DeYoung et al. | |
| 2002/0112746 A1 | 8/2002 | DeYoung et al. | |
| 2002/0115022 A1 | 8/2002 | Messick et al. | |
| 2002/0117391 A1 | 8/2002 | Beam | |
| 2002/0123229 A1 | 9/2002 | Ono et al. | |
| 2002/0127844 A1 | 9/2002 | Grill et al. | |
| 2002/0132192 A1 | 9/2002 | Namatsu | |
| 2002/0141925 A1 | 10/2002 | Wong et al. | |
| 2002/0142595 A1 | 10/2002 | Chiou | |
| 2002/0150522 A1 | 10/2002 | Heim et al. | |
| 2003/0003762 A1 | 1/2003 | Cotte et al. | |
| 2003/0008238 A1 | 1/2003 | Goldfarb et al. | |
| 2003/0205510 A1 * | 11/2003 | Jackson | 210/86 |
| 2004/0020518 A1 * | 2/2004 | DeYoung et al. | 134/30 |

FOREIGN PATENT DOCUMENTS

| | | | |
|---|---|---|---|
| DE | 43 44 021 A1 | 6/1995 | D06P/1/16 |
| EP | 0 283 740 A2 | 9/1988 | C22B/3/00 |
| EP | 0 302 345 A2 | 2/1989 | C22B/3/00 |
| EP | 0 370 233 A1 | 5/1990 | C22B/3/00 |
| EP | 0 391 035 A2 | 10/1990 | C23G/5/00 |
| EP | 0 518 653 B1 | 12/1992 | D06L/1/02 |
| EP | 0 536 752 A2 | 4/1993 | C11D/3/20 |
| EP | 0 572 913 A1 | 12/1993 | B01D/11/02 |
| EP | 0 620 270 A3 | 10/1994 | C11D/7/50 |
| EP | 0 679 753 B1 | 11/1995 | D06F/43/00 |
| EP | 0 711 864 B1 | 5/1996 | D06G/1/00 |
| EP | 0 726 099 A2 | 8/1996 | B08B/5/00 |
| EP | 0 727 711 A2 | 8/1996 | G03F/7/004 |
| EP | 0 822 583 A2 | 2/1998 | H01L/21/306 |
| EP | 0 829 312 A2 | 3/1998 | B08B/3/08 |
| EP | 0 836 895 A2 | 4/1998 | B08B/7/00 |
| JP | 60-192333 | 9/1985 | H01L/21/30 |
| JP | 1-045131 | 2/1989 | B01D/11/04 |
| JP | 1-246835 | 10/1989 | H01L/21/304 |
| JP | 2-209729 | 8/1990 | H01L/21/302 |
| JP | 2-304941 | 12/1990 | H01L/21/56 |
| JP | 7-142333 | 6/1995 | H01L/21/027 |
| JP | 8-186140 | 7/1996 | H01L/21/56 |
| JP | 8-222508 | 8/1996 | H01L/21/027 |
| WO | WO 90/06189 | 6/1990 | B08B/7/00 |
| WO | WO 90/13675 | 11/1990 | C22B/3/00 |
| WO | WO 93/14255 | 7/1993 | D06B/5/16 |
| WO | WO 93/14259 | 7/1993 | D06M/11/76 |
| WO | WO 93/20116 | 10/1993 | C08F/14/18 |
| WO | WO 96/27704 | 9/1996 | D06L/1/00 |
| WO | WO 99/49998 | 10/1999 | B08B/5/00 |
| WO | WO 00/73241 A1 | 12/2000 | C04B/35/622 |
| WO | WO 02/09894 A2 | 2/2002 | |
| WO | WO 02/11191 A2 | 2/2002 | H01L/21/00 |
| WO | WO 02/16051 A2 | 2/2002 | |

OTHER PUBLICATIONS

"Supercritical Carbon Dioxide Resist Remover, SCORR, the Path to Least Photoresistance," Los Alamos National Laboratory, 1998.

Guan, Z. et al., "Fluorocarbon–Based Heterophase Polymeric Materials. 1. Block Copolymer Surfactants for Carbon Dioxide Applications," Macromolecules, vol. 27, 1994, pp. 5527–5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872–874.

Ziger, D.H. et al., "Compressed Fluid Technology: Application to RJE Developed Resists," AlChE Journal, vol. 33, No. 10, Oct. 1987, pp 1585–1591.

Kirk–Othmer, "Alcohol Fuels to Toxicology," Encyclopedia of Chemical Terminology, 3rd ed., Supplement Volume, New York: John Wiley & Sons, 1984, pp. 872–893.

"Cleaning with Supercritical $CO_1$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Sun, Y.P. et al., "Preparation of Polymer–Protected Semiconductor Nanoparticles Through the Rapid Expansion of Supercritical Fluid Solution," Chemical Physics Letters, pp. 585–588, May 22, 1998.

Jackson, K. et al., "Surfactants and Micromulsions in Supercritical Fluids," Supercritical Fluid Cleaning. Noyes Publications, Westwood, NJ, pp. 87–120, Spring 1998.

Kryszewski, M., "Production of Metal and Semiconductor Nanoparticles in Polymer Systems," Polimery, pp. 65–73, Feb. 1998.

Bakker, G.L. et al., "Surface Cleaning and Carbonaceous Film Removal Using High Pressure, High Temperaure Water, and Water/C02 Mixtures," J. Electrochem. Soc, vol. 145, No. 1, pp. 284–291, Jan. 1998.

Ober, C.K. et al., "Imaging Polymers with Supercritical Carbon Dioxide," Advanced Materials, vol. 9, No. 13, 1039–1043, Nov. 3, 1997.

Russick, E.M. et al, "Supercritical Carbon Dioxide Extraction of Solvent from Micro–machined Structures." Supercritical Fluids Extraction and Pollution Prevention, ACS Symposium Series, vol. 670, pp. 255–269,21 Oct. 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270–279, Oct. 21, 1997.

Wai, C.M., "Supercritical Fluid Extraction: Metals as Complexes," Journal of Chromatography A, vol. 785, pp. 369–383, Oct. 17, 1997.

Xu, C. et al, "Submicron–Sized Spherical Yttrium Oxide Based Phosphors Prepared by Supercritical CO2–Assisted aerosolization and pyrolysis," Appl. Phys. Lett., vol. 71, No. 12, Sep. 22, 1997, pp. 1643–1645.

Tomioka Y. et al., "Decomposition of Tetramethylammonium (TMA) in a Positive Photo–resist Developer by Supercritical Water," Abstracts of Papers 214$^{th}$ ACS Natl Meeting, American Chemical Society, Abstract No. 108, Sep. 7, 1997.

Klein, H. et al., "Cyclic Organic Carbonates Serve as Solvents and Reactive Diluents," Coatings World, pp. 38–40, May 1997.

Bühler, J. et al., Linear Array of Complementary Metal Oxide Semiconductor Double–Pass Metal Micro–mirrors, Opt. Eng., vol. 36, No. 5, pp 1391–1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343–348, Jan. 1997.

McClain, J.B. et al., "Design of Nonionic Surfactants for Supercritical Carbon Dioxide," Science, vol. 274, Dec. 20, 1996. pp. 2049–2052.

Zhaidi, L. et al., "Batch and Semi–Continuous Synthesis of Magnesium Oxide Powers from Hydrolysis and Supercritical Treatment of Mg(OCH3)2," Materials Research Bulletin, vol. 31, No. 12, pp. 1527–1335, Dec. 1996.

Tadros, M.E., "Synthesis of Titanium Dioxide Particles in Supercritical CO2," J. Supercritical Fluids, vol. 9, pp. 172–176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539–2545, Aug. 1996.

Gabor, A, et al., "Block and Random Copolymer resists Designed for 193 nm Lithography and Environmentally Friendly Supercritical CO2 Development,", SPIE, vol. 2724, pp. 410–417, Jun. 1996.

Schimek, G.L. et al., "Supercritical Ammonia Synthesis and Characterization of Four New Alkali Metal Silver Antimony Sulfides . . . ," J. Solid State Chemistry, vol. 123 pp. 277–284, May 1996.

Gallagher–Wetmore, P. et al., "Supercritical Fluid Processing: Opportunities for New Resist Materials and Processes," SPIE, vol. 2725, pp. 289–299, Apr. 1996.

Papathomas, K.I. et al., "Debonding of Photoresists by Organic Solvents," J. Applied Polymer Science, vol. 59, pp. 2029–2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991–1994.

Gloyna, E.F. et al., "Supercritical Water Oxidation Research and Development Update," Environmental Progress, vol. 14, No. 3. pp. 182–192, Aug. 1995.

Gallagher–Wetmore, P. et al., "Supercritical Fluid Processing: A New Dry Technique for Photoresist Developing," SPIE vol. 2438, pp. 694–708, Jun. 1995.

Gabor, A. H. et al., "Silicon–Containing Block Copolymer Resist Materials," Microelectronics Techology—Polymers for Advanced Imaging and Packaging , ACS Symposium Series, vol. 614, pp. 281–298, Apr. 1995.

Tsiartas, P.C. et al., "Effect of Molecular weight Distribution on the Dissolution Properties of Novolac Blends," SPIE, vol. 2438, pp. 264–271, Jun. 1995.

Allen, R.D. et al., "Performance Properties of Near–monodisperse Novolak Resins,"SPIE, vol. 2438, pp. 250–260, Jun. 1995.

Wood, P.T. et al., "Synthesis of New Channeled Structures in Supercritical Amines . . . ," Inorg. Chem., vol. 33, pp. 1556–1558, 1994.

Jerome, J.E. et al., "Synthesis of New Low–Dimensional Quarternary Compounds . . . ," Inorg. Chem, vol. 33, pp. 1733–1734, 1994.

McHardy, J. et al., "Progress in Supercritical CO2 Cleaning," SAMPE Jour., vol. 29, No. 5, pp. 20–27, Sep. 1993.

Purtell, R, et al., "Precision Parts Cleaning using Supercritical Fluids," J. Vac, Sci, Technol. A. vol. 11, No. 4, Jul. 1993, pp. 1696–1701.

Bok, E, et al., "Supercritical Fluids for Single Wafer Cleaning," Solid State Technology, pp. 117–120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019–1022, 1992.

Hansen, B.N. et al., "Supercritical Fluid Transport—Chemical Deposition of Films,"Chem. Mater., vol. 4, No. 4, pp. 749–752, 1992.

Page, S.H. et al., "Predictability and Effect of Phase Behavior of CO2/ Propylene Carbonate in Supercritical Fluid Chromatography," J. Microcol, vol. 3, No. 4, pp. 355–369, 1991.

Brokamp, T. et al., "Syntheses und Kristallstruktur Eines Gemischtvalenten Lithium–Tantalnitrids Li2Ta3N5," J. Alloys and Compounds, vol. 176. pp. 47–60, 1991.

Hybertson, B.M. et al., "Deposition of Palladium Films by a Novel Supercritical Fluid Transport Chemical Deposition Process," Mat. Res. Bull., vol. 26, pp. 1127–1133, 1991.

Ziger, D. H. et al., "Compressed Fluid Technology: Application to RJE–Developed Resists," AiChE Jour., vol. 33, No. 10, pp. 1585–1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298–2306, 1987.

Tolley, W.K. et al., "Stripping Organics from Metal and Mineral Surfaces using Supercritical Fluids," Separation Science And Technology, vol. 22, pp. 1087–1101, 1987.

"Final Report on the Safety Assessment of Propylene Carbonate", J. American College of Toxicology, vol. 6, No. 1, pp. 23–51, 1987.

"Porous Xerogel Films as Ultra–Low Permittivity Dielectrics for ULSI Interconnect Applications", Materials Research Society, pp. 463–469, 1997.

Kawakami et al, "A Super Low–k (k=1.1) Silica Aerogel Film Using Supercritical Drying Technique", IEEE, pp. 143–145, 2000.

R.F. Reidy, "Effects of Supercritical Processing on Ultra Low–K Films", Texas Advanced Technology Program, Texas Instruments, and the Texas Academy of Mathematics and Science.

Anthony Muscat, "Backend Processing Using Supercritical CO2", University of Arizona.

H. Namatsu et al., "Supercritical Drying for Water–Rinsed Systems", J. Vacuum Sci. Tech. B 18 (6), 3308 (2000).

N. Sundararajan et al., "Supercritical CO2 Processing for Submicron Imaging of Fluoropolymers", Chem. Mater. 12, 41 (2000).

* cited by examiner

DEVELOPING PHOTORESIST WITH SUPERCRITICAL FLUID AND DEVELOPER

RELATED APPLICATIONS

This Patent Application claims priority under 35 U.S.C. §119(e) of the co-owned U.S. Provisional Patent Application, Serial No. 60/357,756, filed Feb. 15, 2002, entitled "DRYING RESIST WITH A SOLVENT BATH AND SUPERCRITICAL CO2, AND DEVELOPING RESIST WITH SUPERCRITICAL FLUID AND DISSOLVED TMAH," which is hereby incorporated by reference.

FIELD OF THE INVENTION

The present invention relates to the field of developing photoresist. More particularly, the present invention relates to the field of developing photoresist, without pattern collapse or deformation, using a supercritical fluid and resist developer.

BACKGROUND OF THE INVENTION

Fabrication of integrated circuits includes the formation of patterned layers on a semiconductor wafer that form electrically active regions in and on the wafer surface. As part of the manufacturing process, a masking process referred to as photolithography or photomasking is used to transfer a pattern onto the wafer. Masking involves applying a photoreactive polymer or photoresist onto the wafer by any suitable means such as by spinning of the wafer to distribute liquid photoresist uniformly on its surface. In a typical semiconductor manufacturing process, several iterations of the masking process are employed. Layers of either positive or negative photoresist can be used in various combinations on the same wafer.

Typically the wafer is heated or "soft baked" on a hot plate to improve adhesion of the resist to the substrate surface. A photo aligner aligns the wafer to the photomask and then portions of the resist coated wafer are exposed to high-energy light so that a pattern is formed as a latent image in the resist layer. A developing agent is then applied to develop the portions of the resist which were exposed. When positive resist is used, the developed portions of the resist are solubilized by the exposure to high-energy light. Conversely, when negative resist is used, the undeveloped portions of the resist are solubilized. Washing and rinsing steps are carried out that selectively remove the solubilized photoresist. A drying step is carried out.

Pattern formation using the traditional lithographic techniques has been carried out using an aqueous solution of tetramethyl ammonium hydroxide (TMAH) as the developer. For example, Takizawa, in U.S. Pat. No. 6,472,127, issued Oct. 29, 2002, discloses a method of forming a resist pattern, including a develop step performed by applying an aqueous solution containing 2.38% TMAR as an alkali developer to the photoresist film. Nishi, et al., in U.S. Pat. No. 6,492,090, issued Dec. 10, 2002, discloses a polymer, a resist composition, and a process for forming a resist pattern. In the method according to Nishi, et al., development is carried out using as the developer an 0.1 to 5% (preferably 2 to 3%) aqueous solution of TMAH, this being done by a conventional method such as dipping, puddling, or spraying.

While mainly used as a developing agent, TMAH has been used as an etchant in semiconductor manufacturing processes. For example, Wu, et al., in U.S. Pat. No. 6,461,967, issued Oct. 8, 2002, discloses a method of removing material from a semiconductor substrate, which includes an etchant containing TMAH to etch silicon-containing material. Makiyama, et al., in U.S. Pat. No. 6,509,252, issued Jan. 21, 2003, discloses a method of manufacturing a semiconductor device, which includes an etching process wherein the etchant is an aqueous solution of TMAH.

It is known that TMAH can be used to assist in the cleaning step of semiconductor manufacturing processes. For example, Nguyen et al., in U.S. Pat. No. 5,597,983, issued Jan. 28, 1997, discloses a method for removing a via sidewall polymer residue formed incident to an etch, wherein a resist developer containing TMAH is used to remove the polymer residue from the via. Chang, et al., in U.S. Pat. No. 6,232,238, issued May 15, 2001, discloses a method for preventing corrosion of a bonding pad resulting from residual polymers on a surface of a semiconductor wafer. In the method according to Chang, et al., an alkaline developer comprising 2.38% TMAH is used for removing the residual polymers.

While TMAH can be used in various steps of semiconductor manufacturing processes, generally it is contained in an aqueous solution. For example, the traditional develop methods utilize a premixed solution of TMAH dissolved in water and dispensed onto the wafer through differently designed nozzles. This leads to distribution, timing issues, and other problems across the wafer that make it difficult to control critical dimensions and other develop defects. When water is used for rinsing, e.g., for resists developed in an aqueous solution of TMAH, the presence of moisture in the atmosphere can not be avoided. This presents a problem because moisture in the atmosphere can cause acrylate-type resist to swell and pattern deformation can occur. The use of water as the developer solvent and rinse agent causes problems because of its high surface tension, ~72 dyn/cnm, when compared, e.g., to the surface tension of methanol, ~23 dyn/cm.

It is known that capillary forces scale with the surface tension of the rinse solution. A serious problem emerges when the mechanical stability of the resist lines is too weak to compensate for capillary forces exerted by the rinse liquid during the drying step. During drying, unbalanced capillary forces exert a net force on the pattern that tends to deform the resist lines. When the capillary forces exceed the elastic restoring force of the polymer, collapse of the photoresist structure occurs. As noted in the literature, collapse of photoresist structures is a generic term that refers to the deformation (bending), fracture, and/or peeling of resist from the substrate, in response to capillary forces present during the drying stage of a lithographic process. D. Goldfarb et. al, Aqueous-Based Photoresist Drying Using Supercritical Carbon Dioxide to Prevent Pattern Collapse, J. Vacuum Sci. Tech. B 18(6), 3313 (2000).

This problem of collapse of photoresist structures is exacerbated by high-aspect-ratio resist patterns that are desired as the minimum device feature size decreases. As device feature sizes shrink, the thickness of the resist is constant while the width of the pattern decreases. This results in a higher aspect ratio of height to width of resist lines. In general, as the aspect ratio increases, the mechanical stability of the resist lines decreases. The collapse of high-aspect-ratio photoresist structures is related to the surface tension of the rinse solution (capillary forces scale with the surface tension of the rinse solution) and is a function of both the density (spacing) and aspect ratio of resist lines. The collapse of high-aspect-ratio photoresist structures becomes an increasingly serious problem as semiconductor device feature sizes continue to shrink while relative vertical height increases to accommodate more complex interconnect structures.

There is a need for effective methods for developing the resist layer with no pattern collapse or deformation of the photoresist.

SUMMARY OF THE INVENTION

A first embodiment of the present invention is for a method of developing a polymeric film without the need for a water rinse. An object having a surface supporting a polymeric film is placed onto a support region within a pressure chamber. A fluid and developer is introduced into the pressure chamber and the object is processed at supercritical conditions to develop the polymeric film such that the polymeric film is not substantially deformed. The pressure chamber is then vented.

A second embodiment of the present invention is for a method of developing a polymeric film without the need for a water rinse. An object having a surface supporting a polymeric film is placed onto a support region within a pressure chamber. A fluid and developer chemistry is introduced into the pressure chamber and the object is processed at supercritical conditions to develop the polymeric film such that the polymeric film is not substantially deformed. The pressure chamber is then vented.

A third embodiment of the invention is for an apparatus for developing a polymeric film, without the need for a water rinse, including: a pressure chamber including an object support; means for pressurizing the pressure chamber, means for introducing a fluid and developer into the pressure chamber; means for processing the object at supercritical conditions; and means for venting the pressure chamber.

BRIEF DESCRIPTION OF THE DRAWINGS

The present invention may be better understood by reference to the accompanying drawings of which.

DETAILED DESCRIPTION OF THE PREFERRED EMBODIMENTS

The following detailed description with reference to the accompanying drawing is illustrative of various embodiments of the invention. The present invention should not be construed as limited to the embodiments set forth herein. Therefore, the following detailed description is not to be taken in a limiting sense, and the scope of the present invention is defined by the accompanying claims.

The present invention is directed to a process of developing a polymeric film, such as a photoresist layer on a surface of a semiconductor substrate or wafer that has been fabricated in accordance with methods well known in the art of manufacturing semiconductor devices. The methods in accordance with the present invention utilize the low viscosity and high solvating and solubilizing properties of supercritical fluids, such as supercritical sulfur hexafluoride, to assist in the develop process. The methods in accordance with the present invention eliminate the need for a water rinse step.

For purposes of the invention, "sulfur hexafluoride" should be understood to refer to sulfur hexafluoride ($SF_6$) employed as a fluid in a liquid, gaseous or supercritical (including near-supercritical) state. "Liquid sulfur hexafluoride" refers to $SF_6$ at vapor-liquid equilibrium conditions. If liquid $SF_6$ is used, the temperature employed is preferably below 46° C. "Supercritical sulfur hexafluoride" refers herein to $SF_6$ at conditions above the critical temperature (46° C.) and critical pressure (37 atm). When $SF_6$ is subjected to temperatures and pressures above 46° C. and 37 atm, respectively, it is determined to be in the supercritical state. "Near-supercritical sulfur hexafluoride" refers to $SF_6$ within about 85% of absolute critical temperature and critical pressure.

As used herein, "substrate" includes a wide variety of structures such as semiconductor device structures with a deposited photoresist. A substrate can be a single layer of material, such as a silicon wafer, or can include any number of layers. A substrate can be comprised of various materials, including metals, ceramics, glass, or compositions thereof.

Various polymeric films can be developed using the processes and apparatus of the present invention. The present invention, though applicable to the semiconductor industry, is not limited thereto. For the purposes of the invention, "develop" should be understood to be consistent with its conventional meaning in the art.

Figure 1:
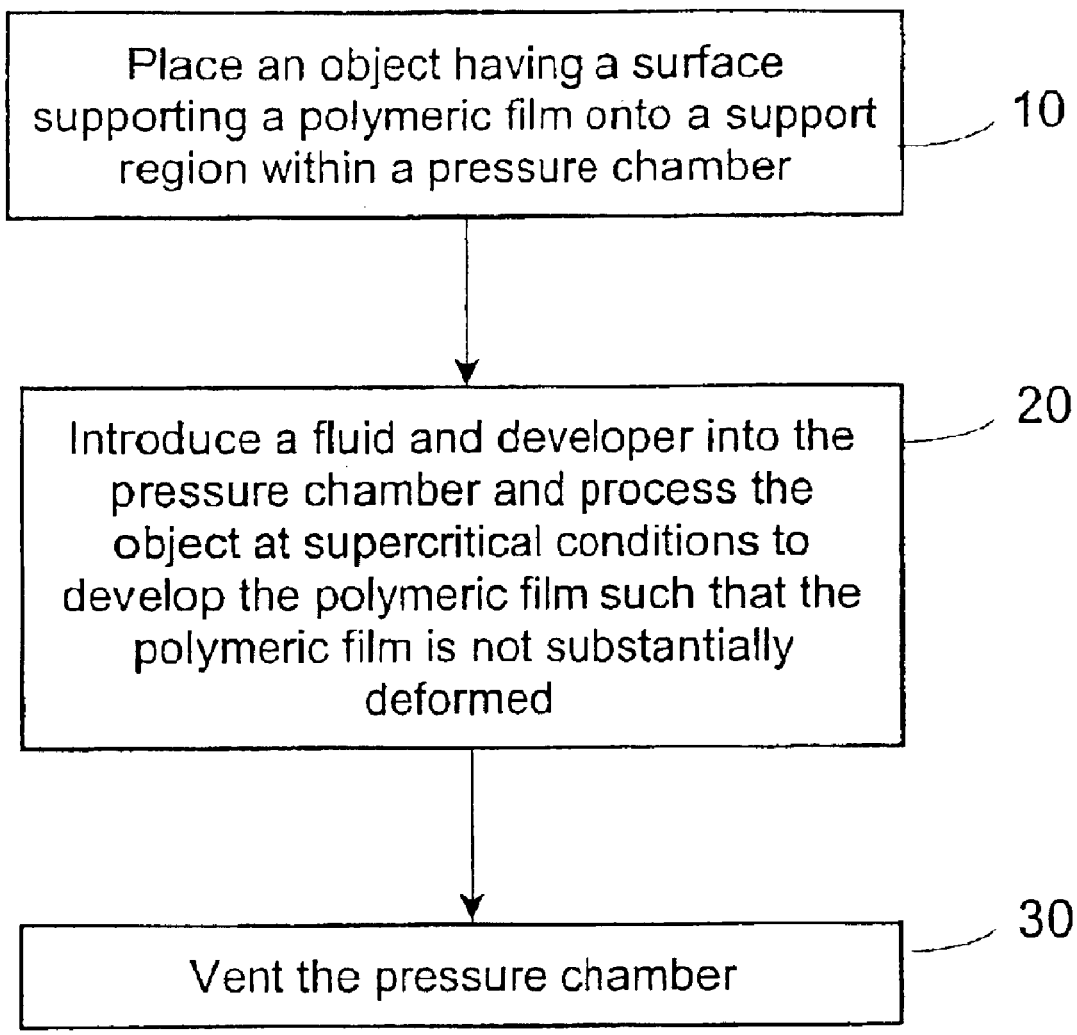
FIG. 1 is a flow chart showing a process flow for a method of developing a polymeric film, without the need for a water rinse step, in accordance with the present invention.

FIG. 1 is a flow chart showing a process flow for a method of developing a polymeric film without the need for a water rinse step. In the preferred embodiment of the present invention, an object having a surface supporting a polymeric film is placed onto a support region within a pressure chamber (10). For purposes of the invention, "object" includes: a substrate including metals, ceramics, glass, and composite mixtures thereof; a semiconductor wafer for forming integrated circuits; and other objects requiring photoresist developing. It should be appreciated that the surface of the object, or at least a portion thereof, is coated with a polymeric film such as photoresist. In one embodiment of the invention, the polymeric film comprises a photoresist that includes high-aspect-ratio photoresist structures.

In the preferred embodiment of the invention, a fluid and developer are introduced into the pressure chamber and the object is processed at supercritical conditions to develop the polymeric film such that the polymeric film is not substantially deformed (20). In a preferred embodiment of the invention, the fluid is sulfur hexafluoride ($SF_6$). The advantages of using $SF_6$ as the fluid in supercritical process include that the critical point is relatively low, it is chemically inert to various photoresists, non flammable, non toxic, non corrosive, and can solubilize organic solvents at moderate pressures. However, it should be understood that the methods and apparatus of the present invention are not limited to the use of $SF_6$ as the fluid.

In a preferred embodiment of the invention, the developer comprises tetramethyl ammonium hydroxide (TMAH). In other embodiments, the developer comprises $R_4AH$ or tetra-R-ammonium hydroxide, where R= aliphatic, aromatic and can be fluorinated or non-fluorinated.

In a preferred embodiment of the invention, processing the object at supercritical conditions to develop the polymeric film includes pressurizing the pressure chamber and recirculating the fluid and developer within the pressure chamber. In one embodiment of the invention, the pressure chamber is pressured with gaseous, liquid, supercritical or near-supercritical $SF_6$. Preferably, the fluid and developer are recirculated within the pressure chamber for a period of time to develop the polymeric film on a surface of the object.

In one embodiment, processing the object at supercritical conditions includes spinning the object. The pressure chamber is then vented (30).

Figure 2:
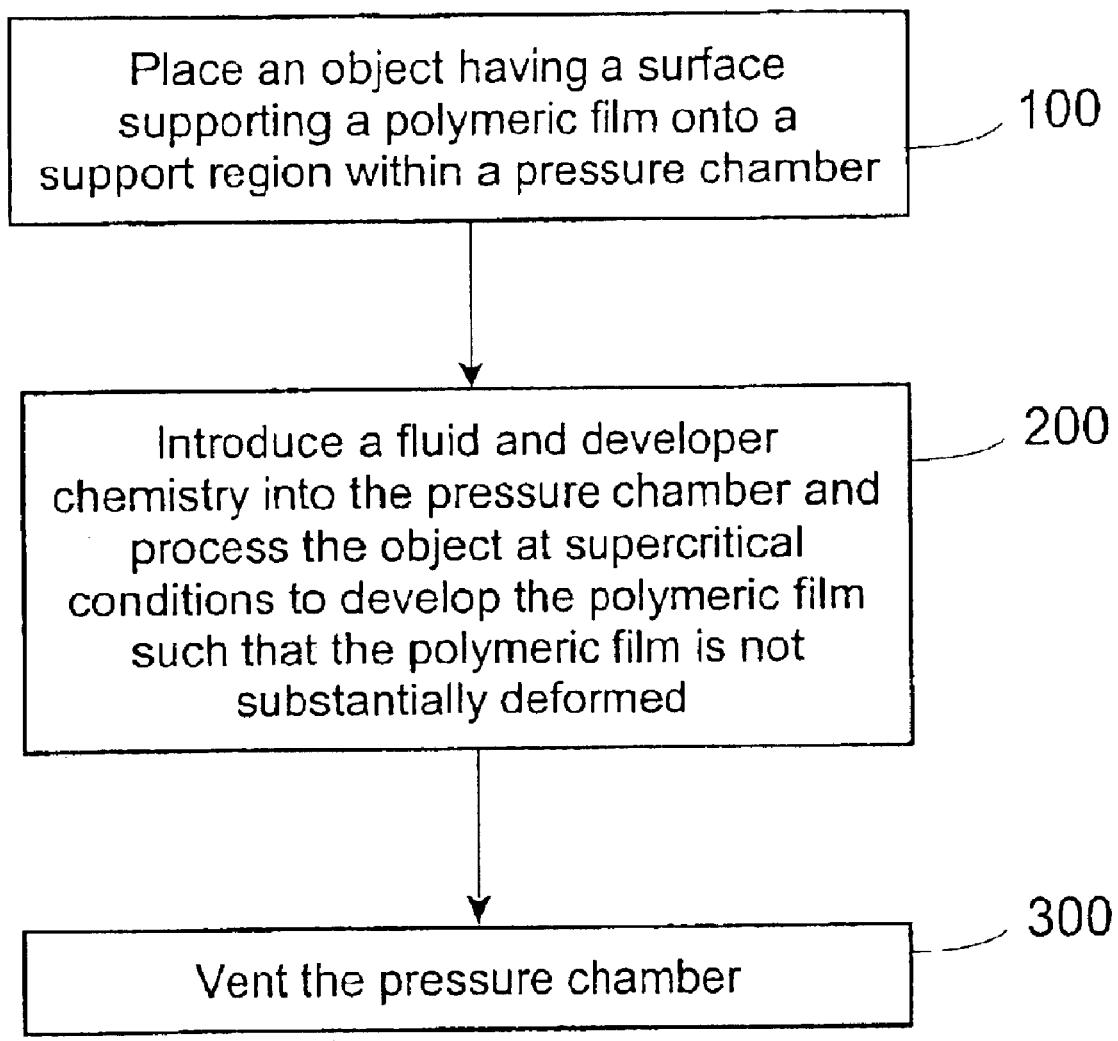
FIG. 2 is a flow chart showing a process flow for a method of developing a polymeric film, without the need for a water rinse step, in accordance with the present invention.

FIG. 2 is a flow chart showing a process flow for a method of developing a polymeric film without the need for a water rinse step. In a preferred embodiment of the present invention, an object having a surface supporting a polymeric film is placed onto a support region within a pressure chamber (100).

In a preferred embodiment of the invention, a fluid and developer chemistry are introduced into the pressure chamber and the object is processed at supercritical conditions to develop the polymeric film such that the polymeric film is not substantially deformed (200). One benefit of a fluid and "developer chemistry" is the ease of changing the developer concentration. In one embodiment of the invention, the developer chemistry comprises a developer dissolved in an inert gas. In one embodiment, the developer comprises TMAH. In one embodiment, the inert gas is $SF_6$.

In one embodiment of the invention, processing the object at supercritical conditions to develop the polymeric film includes pressurizing the pressure chamber and recirculating the fluid and developer chemistry within the pressure chamber. In one embodiment of the invention, the pressure chamber is pressured with gaseous, liquid, supercritical or near-supercritical $SF_6$. Preferably, the fluid and developer chemistry are recirculated within the pressure chamber for a period of time to develop the polymeric film on a surface of the object. The pressure chamber is then vented (300).

A third embodiment of the invention is for an apparatus for developing a polymeric film without the need for a water rinse step. In a preferred embodiment of the present invention, a pressure chamber including an object support is provided. There is means for pressurizing the pressure chamber such as a pump. In a preferred embodiment, means for processing the object at supercritical conditions is provided. The details concerning one example of a pressure chamber for supercritical processing are disclosed in co-owned and co-pending U.S. patent applications, Ser. No. 09/912,844, entitled "HIGH PRESSURE PROCESSING CHAMBER FOR SEMICONDUCTOR SUBSTRATE," filed Jul. 24, 2001, and Ser. No. 09/970,309, entitled "HIGH PRESSURE PROCESSING CHAMBER FOR MULTIPLE SEMICONDUCTOR SUBSTRATES," filed Oct. 3, 2001, which are incorporated by reference. There is means for venting the pressure chamber such as a vent.

While the processes and apparatuses of this invention have been described in detail for the purpose of illustration, the inventive processes and apparatuses are not to be construed as limited thereby. It will be readily apparent to those of reasonable skill in the art that various modifications to the foregoing preferred embodiments can be made without departing from the spirit and scope of the invention as defined by the appended claims.

What is claimed is:

1. A method of developing a polymeric film, without the need for a water rinse step, comprising the steps of:
   a. placing an object having a surface supporting a polymeric film onto a support region within a pressure chamber;
   b. introducing a fluid and developer into the pressure chamber and processing the object at supercritical conditions such that the polymeric film is not substantially deformed; and
   c. venting the pressure chamber.

2. The method of claim 1 wherein the object is a semiconductor wafer for forming integrated circuits.

3. The method of claim 1 wherein the polymeric film is a photoresist.

4. The method of claim 3 wherein the photoresist comprises a photoresist having high-aspect-ratio photoresist structures.

5. The method of claim 1 wherein the fluid comprises a material that is chemically unreactive to the developer.

6. The method of claim 5 wherein the fluid is sulfur hexafluoride.

7. The method of claim 1 wherein the developer comprises tetramethyl ammonium hydroxide.

8. The method of claim 1 wherein the developer comprises tetra-R-ammonium hydroxide.

9. The method of claim 8 wherein the tetra-R-ammonium hydroxide is fluorinated.

10. The method of claim 8 wherein the tetra-R-ammonium hydroxide is non-fluorinated.

11. The method of claim 1 wherein processing the object at supercritical conditions comprises:
   a. pressurizing the pressure chamber; and
   b. recirculating the fluid and developer within the pressure chamber.

12. The method of claim 11 wherein pressurizing the pressure chamber comprises pressurizing the pressure chamber with at least one of gaseous, liquid, supercritical and near-supercritical sulfur hexafluoride.

13. The method of claim 11 wherein recirculating the fluid and developer within the pressure chamber comprises recirculating the fluid and developer within the pressure chamber for a period of time to develop the polymeric film on a surface of the object.

14. The method of claim 11 wherein processing the object at supercritical conditions further comprises spinning the object.

15. A method of developing a polymeric film, without the need for a water rinse step, comprising the steps of:
   a. placing an object having a surface supporting a polymeric film onto a support region within a pressure chamber;
   b. introducing a fluid and developer chemistry into the pressure chamber and processing the object at supercritical conditions to develop the polymeric film such that the polymeric film is not substantially deformed; and
   c. venting the pressure chamber.

16. The method of claim 15 wherein the developer chemistry comprises a developer dissolved in an inert gas.

17. The method of claim 16 wherein the developer comprises tetramethyl ammonium hydroxide.

18. The method of claim 16 wherein the developer comprises tetra-R-ammonium hydroxide.

19. The method of claim 18 wherein the tetra-R-ammonium hydroxide is fluorinated.

20. The method of claim 18 wherein the tetra-R-ammonium hydroxide is non-fluorinated.

21. The method of claim 16 wherein the inert gas is sulfur hexafluoride.

22. The method of claim 15 wherein processing the object at supercritical conditions comprises:
   a. pressurizing the pressure chamber; and
   b. recirculating the fluid and developer chemistry within the pressure chamber.

* * * * *

UNITED STATES PATENT AND TRADEMARK OFFICE
CERTIFICATE OF CORRECTION

PATENT NO. : 6,924,086 B1 Page 1 of 1
DATED : August 2, 2005
INVENTOR(S) : Chantal J. Arena-Foster et al.

It is certified that error appears in the above-identified patent and that said Letters Patent is hereby corrected as shown below:

Column 1,
Line 56, replace "2.38 % TMAR" with -- 2.38% TMAH --.

Signed and Sealed this

Fourth Day of October , 2005

JON W. DUDAS
*Director of the United States Patent and Trademark Office*